United States Patent [19]
Campardo et al.

[11] Patent Number: 5,923,076
[45] Date of Patent: Jul. 13, 1999

[54] INTEGRATED DEVICE WITH PADS

[75] Inventors: Giovanni Campardo, Bergamo; Matteo Zammattio, Milan; Stefano Ghezzi, Treviolo, all of Italy

[73] Assignee: SGS-Thomas Microelectronics S.r.l., Agrate Brianza, Italy

[21] Appl. No.: 08/811,577

[22] Filed: Mar. 5, 1997

[30] Foreign Application Priority Data

Mar. 6, 1996 [EP] European Pat. Off. ............. 96830095

[51] Int. Cl.⁶ .................................................. H01L 29/78
[52] U.S. Cl. .......................... 257/533; 257/773; 257/784
[58] Field of Search ................................. 257/533, 532, 257/534, 773, 784

[56] References Cited

U.S. PATENT DOCUMENTS 4,710,791  12/1987  Shirato et al. ......................... 257/533

FOREIGN PATENT DOCUMENTS 61-12056   1/1986  Japan ..................................... 257/533
61-279168  12/1986 Japan ..................................... 257/533
1-241858   9/1989  Japan ..................................... 257/533

OTHER PUBLICATIONS

European Search Report from European Patent Application 96830095.4, filed Mar. 6, 1996.
Patent Abstracts of Japan, vol. 014, No. 396 (E–0970), Aug. 27, 1990 & JP–A–02 148845 (Hitachi Ltd.).
Patent Abstracts of Japan, vol. 012, No. 489 (E–696), Dec. 21, 1988 & JP–A–63 204755 (NEC Corp.).
Patent Abstracts of Japan, vol. 011, No. 130 (E–502), Apr. 23, 1987 & JP–A–61 274352 (Fujitsu Ltd.).
Patent Abstracts of Japan, vol. 015, No. 094 (E–1041), Mar. 6, 1991 & JP–A–02 304963 (NEC Corp.).
Patent Abstracts of Japan, vol. 014, No. 518 (e–1001), Nov. 14, 1990 & JP–A–02 216862 (NEC Corp.).

*Primary Examiner*—Donald L. Monin, Jr.
*Attorney, Agent, or Firm*—Wolf, Greenfield & Sacks, P.C.

[57] ABSTRACT

An integrated device having an N-type well region formed in a P-type substrate and an N⁺type contact ring housed in the well region. The well region forms respective capacitors with a conductive layer superimposed on the substrate, and with the substrate itself. The conductive layer and the substrate are grounded, and the contact ring is connected to the supply, so that the two capacitors are in parallel to each other and, together with the internal resistance of the well region, form a filter for stabilizing the supply voltage. When connected to an input buffer stage of the device, the filter provides for damping the peaks produced on the supply line of the input buffer by high-current switching of the output buffers.

41 Claims, 3 Drawing Sheets

INTEGRATED DEVICE WITH PADS

BACKGROUND OF THE INVENTION

1. Field of the Invention

The present invention relates to an integrated device with pads. More specifically, the invention relates to utilizing capacitances formed within the device beneath the pads.

2. Discussion of the Related Art

As is known, integrated circuits within a device are connected electrically to the outside of the device by means of pads. The pads are exposed metal regions, surrounded by insulating material and connected electrically to the input and output components of the device to permit connection of the components to respective pins by means of respective bonding wires.

The various superimposed layers of insulating and conductive material formed on a substrate and forming the device itself normally extend beneath the pad so that the upper surface of the device is flat.

FIG. 1 illustrates a known structure of the device region beneath the pads. FIG. 1 shows a vertical section of an integrated device 1 comprising a substrate 2 of P-type semiconductor material (typically silicon) on which are superimposed: a first dielectric layer 6 forming a field oxide layer; a first conductive layer 7 of polycrystalline silicon, typically used to form the gate regions of the components; a second dielectric layer 8, preferably of silicon oxide; a second conductive layer 9 of metal material to form the first metal level; a conductive portion 10 of metal material (so-called "vias") surrounded by an insulating layer 13; a third conductive layer 11 of metal material to form the second metal level; and a surface layer 12 of passivation oxide. Conductive portion 10 electrically connects second conductive layer 9 to third conductive layer 11—which are otherwise mutually insulated—to permit external connection of the first metal level.

As shown in FIG. 1, third conductive layer 11 forms a pad 14 not covered by passivation oxide layer 12 for bonding a respective bonding wire (not shown).

The presence of alternating conductive and dielectric layers inside the device results in a series of parasitic capacitors. In particular, a first capacitor 17 between first conductive layer 7 and second conductive layer 9; and a second capacitor 18 between first conductive layer 7 and substrate 2, and in series with first capacitor 17.

Since, in known devices, such parasitic capacitors inside the integrated device are undesirable, the device is designed to minimize their capacitance. Nevertheless, the need for a pad large enough to ensure reliable bonding of the external metal wires, and the necessity for a number of superimposed layers to ensure the device is flat, impose a total capacitance of no less than about 0.35 pF.

On the other hand, in the prior art, the capacitance obtainable is never significant enough for the parasitic capacitors to be used advantageously within the integrated device.

SUMMARY OF THE INVENTION

It is, therefore, an object of the present invention to provide an integrated device wherein the parasitic capacitors beneath the surface of the pad may be exploited within the device itself.

According to the present invention, there is provided an integrated device with pads which includes a semiconductor material body, a first insulating material layer superimposed on the semiconductor material body, a first conductive layer over the first insulating material layer, and at least one pad connected electrically to the first conductive layer. The integrated device further includes a first capacitive element formed between the first conductive layer and a well region in the semiconductor body, a second conductive layer superimposed on the first insulating material layer, and a second capacitive element in parallel with said first capacitive element. A resistive element forms a filter with the first and second capacitive elements.

The present invention includes an integrated device which includes a substrate, an internal well region in the substrate and a contact ring housed in the well region. A first conductive layer is superimposed on the substrate and a first capacitor is formed with the well region and the first conductive layer. A second capacitor is formed with the substrate and the well region and is parallel to the first capacitor. A resistance is formed in the well region to form a filter with the first and second capacitors.

In an embodiment of the present invention, a filter is formed within an integrated device and connected to an input buffer stage of the device for stabilizing a supply voltage. The filter includes a first capacitor formed between a first conductive layer and a well region within a semiconductor material body, a second capacitor in parallel with the first capacitor and formed in the well region within the semiconductor material body, and a resistive element in said well region and connected in series with the first and the second capacitors.

The present invention includes a semiconductor device including a substrate, an internal well region in the substrate, a contact ring housed in the well region and a first conductive layer superimposed on the substrate. In the device, at least one pad is connected electrically to the first conductive layer, at least one capacitive element is formed beneath the pad and a RC filter is formed with the capacitive element beneath the pad.

The present invention includes a semiconductor device including a substrate, a first insulating material layer superimposed on the substrate, a first conductive layer over the first insulating material layer, at least one pad connected electrically to the first conductive layer and a filter element formed beneath the pad. The filter includes a resistive element and at least one parasitic capacitor formed in the semiconductor device.

In an embodiment of the present invention, a contact region is housed in a well region in the semiconductor body and defines an output terminal of a second capacitive element. The contact region is connected to an input buffer stage. The input buffer stage includes an input branch connected between a first and second reference potential line. The input branch includes an enable switch element connected to the first reference potential line and an inverting element connected to the second reference potential line. The enable switch and the inverting element define a common intermediate node connected to the contact region. A filter formed by the first and second capacitive elements and the resistive element may be used for filtering the supply voltage of an input buffer of the integrated device.

BRIEF DESCRIPTION OF THE DRAWINGS

A preferred, non-limiting embodiment of the present invention will be described by way of example with reference to the accompanying drawings, in which.

DETAILED DESCRIPTION

Figure 1:
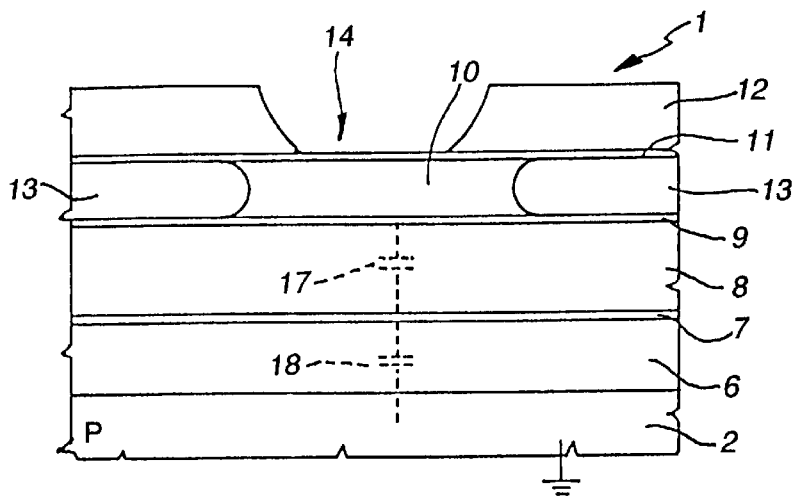
FIG. 1 is a diagram of a vertical section of a known integrated device.
Figure 2:
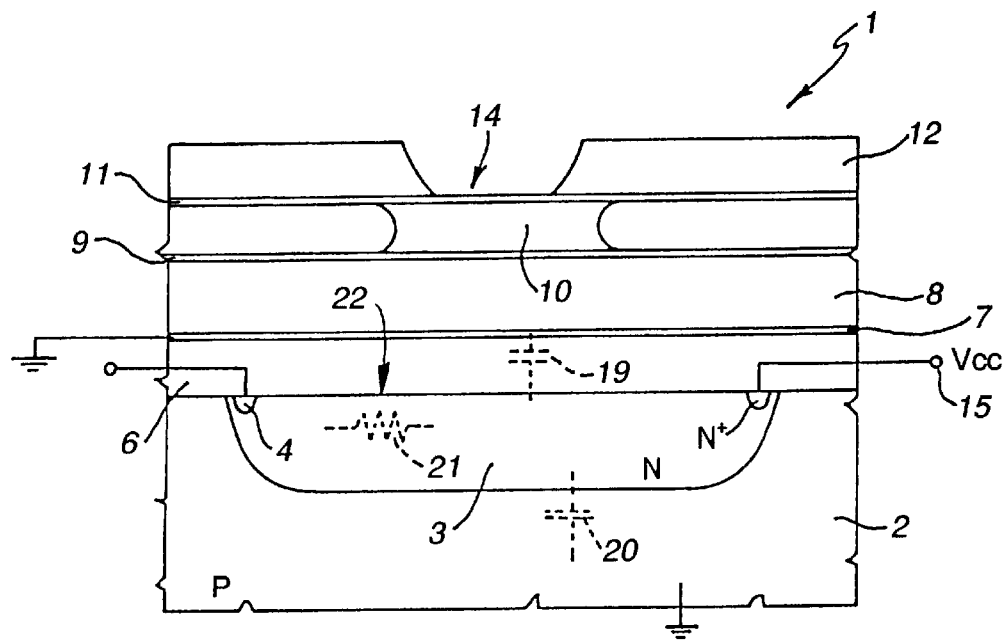
FIG. 2 is a diagram of a vertical section of the integrated device according to the present invention.

Number 1' in FIG. 2 indicates the integrated device according to one embodiment of the present invention, wherein any parts common to the known device 1, as shown in FIG. 1, are indicated using the same numbering system. More specifically, device 1' defines a nonvolatile memory.

Like integrated device 1, memory 1' comprises a substrate 2 on which are superimposed metal and dielectric layers 6, 7, 8, 9, 11, 12 and region 10 connecting layers 9 and 11. The composition and arrangement of the layers are as described for integrated device 1.

Figure 3:
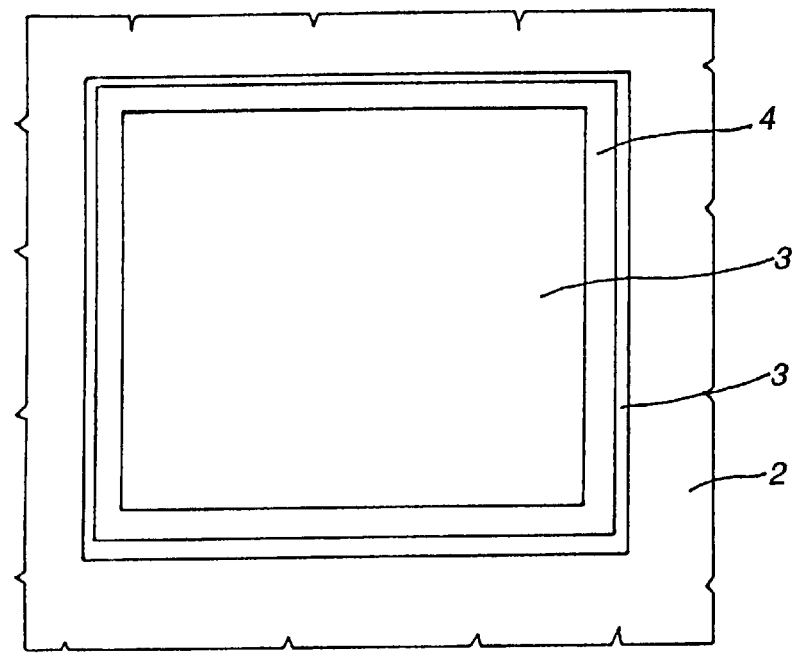
FIG. 3 is a top plan view of the substrate of the FIG. 2 device.

According to one aspect of the present invention, substrate 2 comprises an internal junction region (well region) 3 of N-type silicon, which in turn houses a contact ring 4 of $N^+$ type silicon. Well region 3 and contact ring 4 face the main surface 22 of substrate 2, and therefore directly face first dielectric layer 6, and are substantially square when viewed from above as in FIG. 3.

In memory 1' of FIG. 2, first conductive layer 7, well region 3, and first dielectric layer 6 interposed between layer 7 and region 3 form a capacitor 19 similar to capacitor 18 in FIG. 1; well region 3 forms, with substrate 2, a PN junction with which is associated an equivalent capacitor 20; and FIG. 2 also shows an equivalent resistor 21, which takes into account the resistive path seen by the center of well region 3 towards contact ring 4.

As shown in FIG. 2, first conductive layer 7 and substrate 2 are grounded, while well region 3 is biased by contact regions 4 and the connecting lines, shown only schematically and connected to a terminal 15, e.g. at supply voltage $V_{cc}$, so that capacitors 19 and 20 are parallel and equivalent to a single capacitor with a capacitance equal to the sum of the capacitances of capacitors 19 and 20.

More specifically, with the fabrication processes used in a preferred embodiment of the present invention, with a supply voltage of 3 V (i.e. equal to the reverse bias voltage of the junction between well region 3 and substrate 2), capacitors 20 and 19 respectively present a capacitance of about 2 pF and 0.94 pF, making a total capacitance of about 3 pF.

As shown in FIG. 2, the capacitor equivalent to the parallel connection of capacitors 19, 20 sees resistor 21 in series, so that components 19, 20 and 21 in effect form an RC filter which may be used in memory 1'. Such a filter may be used advantageously for filtering the supply noise of an input buffer of memory 1'.

Switching of the output buffers of nonvolatile memories results in high current flow, which, due to the inductance of the bonding wires connected to the pads of the supply and ground lines, produces voltage peaks on the internal supply lines of the memory. These voltage peaks may generate spurious signals in the memory and, in the case of logic circuits, may result in undesired switching of the components.

Figure 4:
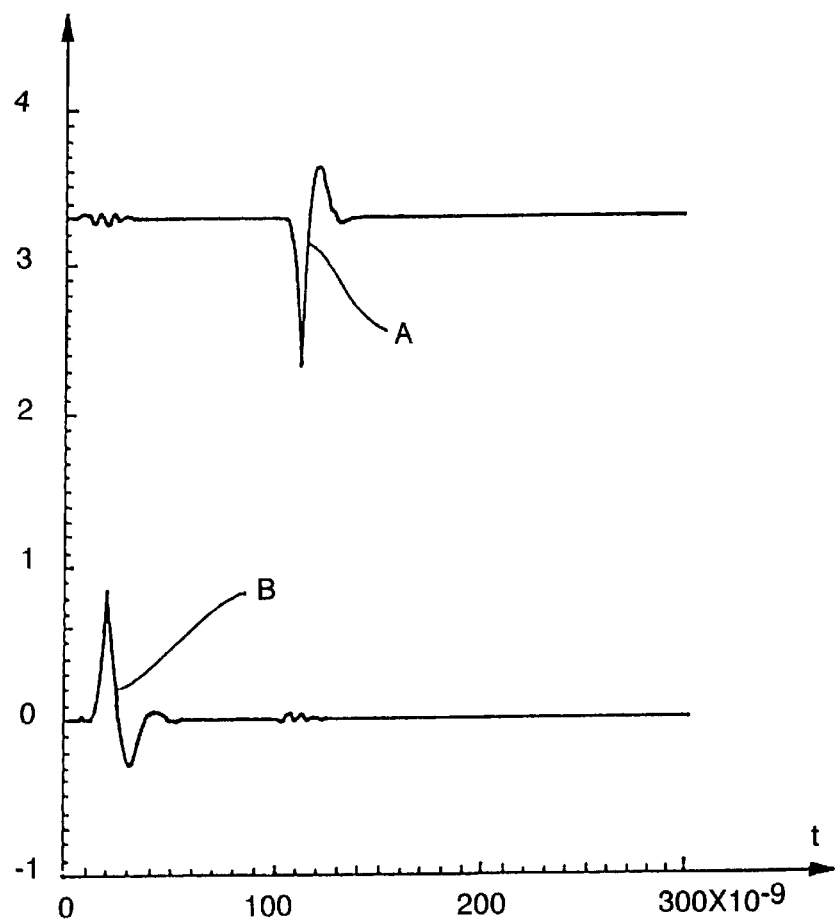
FIG. 4 is a graph illustrating the variation in supply and ground potential of the known integrated device in predetermined operating conditions.

This effect is shown in FIG. 4, which shows two time curves A, B of the supply and ground voltages, respectively, on the internal supply lines of the integrated circuit following switching of the output buffers. The noise effect is manifested in the form of a roughly 1 V downward swing of curve A, and a roughly 1 V upward swing of curve B.

On the other hand, for memory 1' to operate correctly, spurious switching of the internal logic circuits must be avoided, particularly in the case of input buffers with address input terminals supplied with signals which, depending on design specifications, may even present TTL voltage levels. In such buffers, any downward swing in the supply voltage may result in spurious switching and undesired address transition by generating a subsequent read operation in addition to the one actually required.

Figure 5:
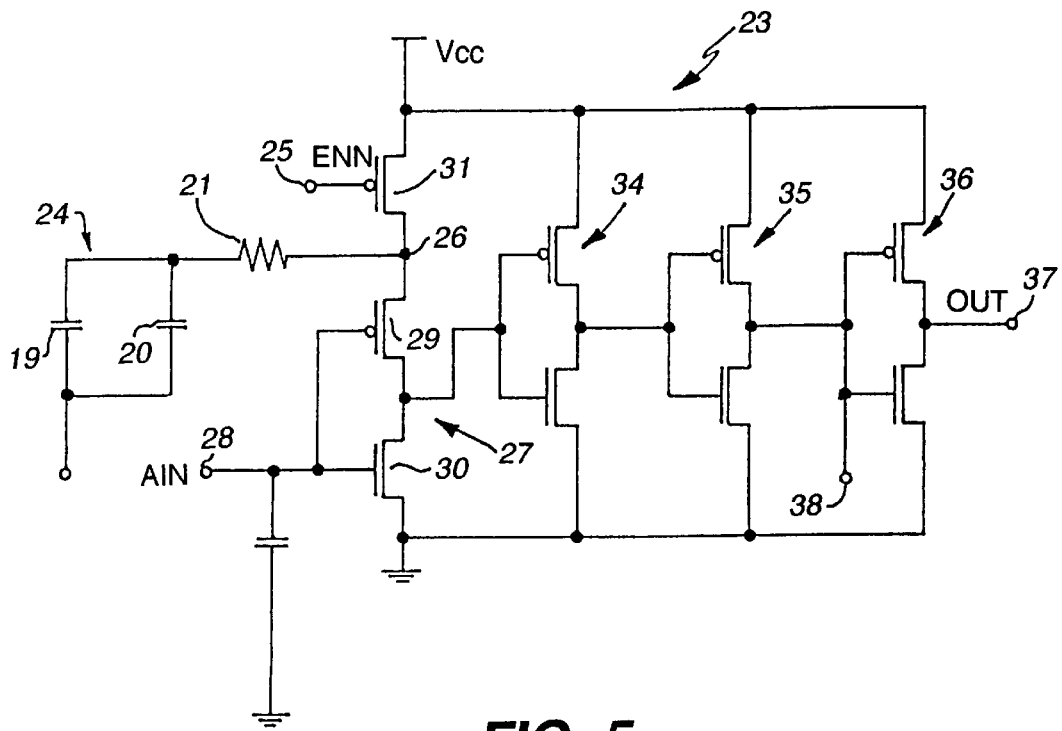
FIG. 5 is a schematic diagram of an input buffer of the device according to the invention.

According to one aspect of the present invention, the filter formed by capacitors 19 and 20 and resistor 21 is used to reduce the noise in the above input buffer as shown in FIG. 5.

In FIG. 5, the input buffer is indicated at 23, and is connected, at a node 26, to a filter 24 comprising equivalent capacitors 19, 20 and equivalent resistor 21.

More specifically, input buffer 23 conventionally comprises a first inverter 27 with an input 28 supplied with an input signal AIN; and a PMOS enable transistor 31 interposed between first inverter 27 and the supply $V_{cc}$, and having a gate terminal 25 supplied with an inverted enable signal ENN. First inverter 27 comprises a second PMOS transistor 29 and a third NMOS transistor 30 connected to each other in series and with the gate terminals connected to each other and to input 28; and, as shown, the source terminal of transistor 29 of first inverter 27 is connected to the source terminal of enable transistor 31 at node 26.

Input buffer 23 also comprises a second, third and fourth inverter 34, 35, 36 cascade connected between the supply line and ground line, wherein the input of second inverter 34 is connected to the output of first inverter 27. Finally, input buffer 23 presents a first output 37 connected to the output of fourth inverter 36 and supplying an OUT signal; and a second output 38 connected to the output of third inverter 35 and supplying an output signal inverted with respect to the OUT signal.

In actual use, input buffer 23 is enabled by the ENN signal which, when low, keeps transistor 31 turned on to supply a signal to first inverter 27. This causes input signal AIN to be transmitted through inverters 27,34,35,36, to outputs 37,38. The input signal AIN is inverted each time it passes through one of inverters 27, 34, 35, 36.

Figure 6:
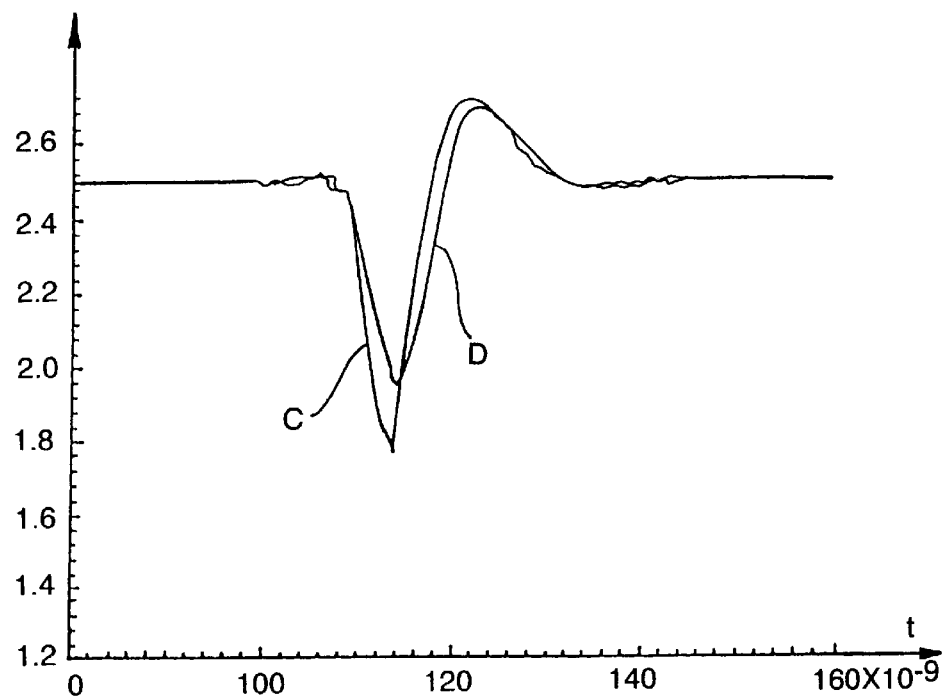
FIG. 6 is a graph of the supply potential obtainable by the device according to the invention.

Filter 24 connected to node 26 of input buffer 23 constitutes a stabilizing element for stabilizing the voltages in the stage itself, as shown in the supply voltage plot in FIG. 6. FIG. 6 shows two time curves C, D, respectively illustrating the supply voltage without and with filter 24, and in the presence of noise elsewhere in the memory (typically, in the output buffers). As can be seen, the stabilizing effect of filter 24 provides, in curve D, for a definite damping of about 200 mV in the downward swing as compared with curve C. Such a noise reduction may prove decisive in the event input voltage AIN is slightly below the trigger threshold of first inverter 27.

In the absence of stabilization, in fact, the downward supply voltage peak may so reduce the voltage between the gate and source terminals of transistor 29 as to turn it off. In this case, if input voltage AIN is such as to turn on transistor 30, inverter 27 will unwontedly be switched temporarily to low. The risk of this occurring, however, is greatly reduced by filter 24 damping the supply voltage peak by roughly 200 mV.

The advantages of the integrated device according to the present invention will be clear from the foregoing description. In particular, it provides for exploiting a formerly unused part and formerly undesired parasitic components of the device.

Moreover, it provides for improved operation and greater reliability of the input buffers, with substantially no increase in fabrication cost or area.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated device comprising:
   a semiconductor material body;
   a first insulating material layer superimposed on said semiconductor material body;
   a first conductive layer over said first insulating material layer;
   at least one pad connected electrically to said first conductive layer;
   a first capacitive element beneath said at least one pad;
   a second capacitive element in parallel with said first capacitive element; and
   a resistive element forming a filter with said first and second capacitive elements, wherein the filter is formed beneath the pad and within a region defined by a contact ring.

2. An integrated device as claimed in claim 1, wherein said semiconductor material body is of a first conductivity type.

3. An integrated device as claimed in claim 2, wherein said second capacitive element comprises a well region in said semiconductor material body beneath said pad, said well region facing said first insulating material layer and having a second conductivity type opposite said first conductivity type, thereby defining a capacitive junction with said semiconductor material body.

4. An integrated device as claimed in claim 3, wherein said well region includes said resistive element.

5. An integrated device as claimed in claim 1, wherein said semiconductor material body and said first conductive layer both have the same potential, said first conductive layer forming, together with said well region, said first capacitive element.

6. An integrated device as claimed in claim 3, wherein a contact region is housed in said well region and faces said first insulating material layer, said contact region defining an output terminal of said second capacitive element.

7. An integrated device as claimed in claim 6, wherein said well region comprises a first doping level, and said contact region having said second conductivity type, comprises a second doping level greater than said first doping level.

8. An integrated device as claimed in claim 1, wherein said first conductive layer is formed of metal material.

9. An integrated device comprising:
   a semiconductor material body;
   a first insulating material layer superimposed on said semiconductor material body;
   a first conductive layer over said first insulating material layer;
   at least one pad connected electrically to said first conductive layer;
   a first capacitive element beneath said at least one pad;
   a second capacitive element in parallel with said first capacitive element;
   a resistive element forming a filter with said first and second capacitive elements; and a second conductive layer superimposed on a second insulating material layer, and said second insulating material layer is interposed between said second conductive layer and said first conductive layer.

10. An integrated device as claimed in claim 6, wherein said contact region is connected to an input buffer stage.

11. An integrated device as claimed in claim 10, wherein said input buffer stage comprises an input branch connected between a first and second reference potential line, said input branch comprising an enable switch element connected to said first reference potential line, and an inverting element connected to said second reference potential line, and said enable switch element and said inverting element defining a common intermediate node connected to said contact region.

12. An integrated device comprising:
    a semiconductor material body;
    a first insulating material layer superimposed on said semiconductor material body;
    a first conductive layer over said first insulating material layer;
    at least one pad connected electrically to said first conductive layer,
    a first capacitive element beneath said at least one pad;
    a second capacitive element in parallel with said first capacitive element; and
    a resistive element forming a filter with said first and second capacitive elements, wherein said device is a nonvolatile memory.

13. An integrated device comprising:
    a substrate;
    an internal well region in said substrate;
    a contact ring housed in said well region;
    a first conductive layer superimposed on said substrate;
    a first capacitor formed with said well region and said first conductive layer;
    a second capacitor formed with said substrate and said well region, said second capacitor parallel to said first capacitor; and
    a resistance formed in said well region and forming a filter with said first and second capacitors.

14. An integrated device as claimed in claim 13, wherein said well region is N-type silicon, said substrate is P-type silicon and said contact ring is N+ type silicon.

15. An integrated device as claimed in claim 13, further comprising at least one pad connected electrically to said first conductive layer, said first conductive layer superimposed over a first insulating material layer, said first insulating material layer superimposed on said substrate.

16. An integrated device as claimed in claim 13, wherein said first conductive layer and said substrate are grounded.

17. An integrated device as claimed in claim 13, wherein said contact ring defines an output terminal of said second capacitor and is connected to a supply voltage.

18. An integrated device as claimed in claim 13, wherein said filter is connected to an input buffer stage of said device for stabilizing a supply voltage.

19. An integrated device as claimed in claim 13, wherein a total capacitance of said first and said second capacitors is 3pF.

20. An integrated device as claimed in claim 13, wherein said device is a nonvolatile memory.

21. A filter formed within an integrated device and connected to an input buffer stage of said device for stabilizing a supply voltage, said filter comprising:
 a first capacitor formed between a first conductive layer and a well region within a semiconductor material body;
 a second capacitor in parallel with said first capacitor, said second capacitor formed in said well region within said semiconductor material body; and
 a resistive element in said well region and connected in series with said first and said second capacitors,
 wherein the first and second capacitors and the resistive element are formed beneath the pad and within a region defined by a contact ring.

22. A filter as claimed in claim 21, wherein an output terminal of said second capacitor is defined by a contact region housed in said well region.

23. A filter as claimed in claim 21, wherein said filter provides for damping peaks produced on a supply line of input buffers in said input buffer stage by high-current switching of output buffers.

24. A filter as claimed in claim 21, wherein said well region and a contact ring housed in said well region directly face a first dielectric layer, said first dielectric layer interposed between a first conductive layer and said well region.

25. A filter formed within an integrated device and connected to an input buffer stage of said device for stabilizing a supply voltage, said filter comprising:
 a first capacitor formed between a first conductive layer and a well region within a semiconductor material body;
 a second capacitor in parallel with said first capacitor, said second capacitor formed in said well region within said semiconductor material body; and
 a resistive element in said well region and connected in series with said first and said second capacitors, wherein said integrated device further comprises:
 a first insulating material layer superimposed on said semiconductor material body;
 a first conductive layer over said first insulating material layer;
 at least one pad connected electrically to said first conductive layer;
 a second insulating material layer superimposed on said first conductive layer; and
 a second conductive layer superimposed on said second insulating material layer.

26. A semiconductor device including:
 a substrate;
 an internal well region in said substrate;
 a contact ring housed in said well region;
 a first conductive layer superimposed on said substrate;
 at least one pad connected electrically to said first conductive layer;
 at least one capacitive element formed beneath said at least one pad; and
 a RC filter formed with said at least one capacitive element beneath said at least one pad and within a region defined by the contact ring.

27. A semiconductor device as claimed in claim 26, wherein said first conductive layer and said substrate are grounded.

28. A semiconductor device as claimed in claim 26, wherein said well region includes a resistive element in said RC filter.

29. A semiconductor device as claimed in claim 26, wherein said substrate and said first conductive layer both have the same potential, said first conductive layer forming, together with said well region, said at least one capacitive element.

30. A semiconductor device as claimed in claim 26, wherein a contact ring formed in said well region in said substrate defines an output of said filter and is connected to a supply voltage.

31. A semiconductor device as claimed in claim 26, wherein said filter is connected to an input buffer stage of said device for stabilizing a supply voltage.

32. A semniconductor device as claimed in claim 26, wherein said device is a nonvolatile memory.

33. A semiconductor device as claimed in claim 26, wherein a second conductive layer is superimposed on a second insulating material layer, and said second insulating material layer is interposed between said second conductive layer and said first conductive layer.

34. A semiconductor device comprising:
 a substrate;
 a first insulating material layer superimposed on said substrate;
 a first conductive layer over said first insulating material layer;
 at least one pad connected electrically to said first conductive layer; and
 a filter element formed beneath said at least one pad and within a region defined by a contact ring, said filter including a resistive element and at least one parasitic capacitor formed in said semiconductor device.

35. A semiconductor device as claimed in claim 34, wherein said first conductive layer and said substrate are grounded.

36. A semiconductor device as claimed in claim 34, wherein said substrate and said first conductive layer both have the same potential, said first conductive layer forming, together with a well region in said substrate, said at least one parasitic capacitor.

37. A semiconductor device as claimed in claim 36, wherein a contact ring formed in said well region in said substrate defines an output of said filter and is connected to a supply voltage.

38. A semiconductor device as claimed in claim 34, wherein said filter is connected to an input buffer stage of said device for stabilizing a supply voltage.

39. A semiconductor device as claimed in claim 34, wherein said device is a nonvolatile memory.

40. A semiconductor device comprising:
 a substrate;
 a first insulating material layer superimposed on said substrate;
 a first conductive laver over said first insulating material layer;
 at least one pad connected electrically to said first conductive layer; and a filter element formed beneath said at least one pad, said filter including a resistive element and at least one parasitic capacitor formed in said semiconductor device said at least one parasitic capacitor formed in said substrate and beneath said pad, wherein a second conductive layer is superimposed on a second insulating material layer, and said second insulating material layer is interposed between said second conductive layer and said first conductive layer.

41. An integrated device comprising:

a substrate;

an internal well region in the substrate;

a contact ring housed in the well region;

a first dielectric layer on the surface of the internal well region;

a first conductive layer over the first dielectric layer;

a second dielectric layer over the first conductive layer;

a second conductive layer over the second dielectric layer;

a conductive portion surrounded by an insulating layer, the conductive portion electrically connecting the second conductive layer to a third conductive layer, wherein the third conductive layer forms a pad not covered by the insulating layer;

an RC filter formed beneath the pad and within a region defined by the contact ring.

* * * * *

UNITED STATES PATENT AND TRADEMARK OFFICE
CERTIFICATE OF CORRECTION

PATENT NO.  :  5,923,076
DATED       :  July 13, 1999
INVENTOR(S):   Giovanni Campardo, Matteo Zammattio and Stefano Ghezzi It is certified that error appears in the above-identified patent and that said Letters Patent is hereby corrected as shown below:

On the title page, item [73] should read:

[73]   Assignee:   SGS-Thomson Microelectronics S.r.l.
                   Agrate Brianza, Italy Signed and Sealed this Seventh Day of December, 1999

Attest:

Q. TODD DICKINSON

*Attesting Officer*   *Acting Commissioner of Patents and Trademarks*